(12) United States Patent  (10) Patent No.: US 8,433,148 B2
Porikli  (45) Date of Patent: Apr. 30, 2013

(54) METHOD FOR COMPRESSING TEXTURED IMAGES

(75) Inventor: Fatih Porikli, Watertown, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 252 days.

(21) Appl. No.: 13/076,522

(22) Filed: Mar. 31, 2011

(65) Prior Publication Data

US 2012/0251013 A1 Oct. 4, 2012

(51) Int. Cl.
*G06K 9/36* (2006.01)
*G06K 9/46* (2006.01)

(52) U.S. Cl.
USPC .............. 382/232; 382/248; 382/277

(58) Field of Classification Search .............. 382/232, 382/233, 234, 240, 248, 277, 280
See application file for complete search history.

(56) References Cited

U.S. PATENT DOCUMENTS

| | | | |
|---|---|---|---|
| 5,983,251 A | 11/1999 | Martens et al. | |
| 6,160,918 A * | 12/2000 | Pigeon | 382/248 |
| 6,909,807 B2 * | 6/2005 | Chu et al. | 382/232 |
| 7,242,811 B2 * | 7/2007 | Fenney | 382/240 |
| 7,400,772 B1 | 7/2008 | Keenan | |
| 7,899,263 B2 * | 3/2011 | Li et al. | 382/248 |
| 2008/0031404 A1 | 2/2008 | Khamene et al. | |
| 2010/0008424 A1 | 1/2010 | Pace | |

FOREIGN PATENT DOCUMENTS

WO WO9907157 * 2/1999

OTHER PUBLICATIONS

Christopher Jason Ogden et al., "The Singular Value Decomposition and It's Applications in Image Processing," Dec. 18, 1997; XP55031940, Retrieved from Internet URL:http://oonline.redwoods.cc.ca.us/ubstryct/darnold/lapproj/Fall97/Tammie/tammie.pdf.

* cited by examiner

*Primary Examiner* — Phuoc Tran
(74) *Attorney, Agent, or Firm* — Dirk Brinkman; Gene Vinokur

(57) ABSTRACT

A method compresses an image partitioned into blocks of pixels, for each block the method converts the block to a 2D matrix. The matrix is decomposing into a column matrix and a row matrix, wherein a width of the column matrix is substantially smaller than a height of the column matrix and the height of the row matrix is substantially smaller than the width of the row matrix. The column matrix and the row matrix are compressed, and the compressed matrices are then combined to form a compressed image.

28 Claims, 5 Drawing Sheets

METHOD FOR COMPRESSING TEXTURED IMAGES

FIELD OF THE INVENTION

This invention relates generally to textured images, and more particularly to compressing textured images by a decomposition of textured images into a multiplication of a row dominant matrix and a column dominant matrix.

BACKGROUND OF THE INVENTION

Conventional image (and video) compression methods, such as JPEG (MPEG, H.264, involve partitioning an image into square blocks, and processing each block independently using some intra-frame dependences. Videos also use interframe dependencies.

JPEG

JPEG is an image compression standard. It applies a discrete cosine transform (DCT) encoder that includes a quantization and entropy encoding within image (macro) blocks, often 6×8 or 16×16 pixels in size.

Due to a high correlation among three color components, the first step is usually to change from a RGB color space to a YCbCr color space. Generally, human visual perception is more sensitive to illumination, and less sensitive to saturation. Therefore, such a color transform helps to reduce the bit rate by keeping more illumination and less saturation data. The transformation into the YCbCr color space reduces the spatial resolution of the Cb and Cr components by down-sampling, and chroma subsampling.

The ratios at which the down-sampling is usually done for PEG images are 4:4:4 (no down-sampling), 4:2:2 (reduction by a factor of two in the horizontal direction), or (most commonly) 4:2:0 (reduction by a factor of 2 in both the horizontal and vertical directions). During the compression process, the Y, Cb and Cr channels are processed separately, and in a very similar manner.

After the color transformation, the image is partitioned into non-overlapping blocks. The color values of pixels are shifted from unsigned integers to signed integers. Then, a 2D DCT is applied.

For an 8-bit image, the intensity of each pixel is in the range [0, 255]. The mid-point of the range is subtracted from each entry to produce a data range that is centered around zero, so that the modified range is [−128, +127]. This step reduces the dynamic range requirements in the DCT processing stage that follows. This step is equivalent to subtracting 1024 from the DC coefficient after performing the transform, which is faster on some architectures because it involves performing only one subtraction rather than 64.

Each 8×8 block of the image is effectively a 64-point discrete signal, which is a function of the two spatial dimensions x and y. The DCT takes such a signal and decomposes it into 64 unique, two-dimensional spatial frequencies, which comprise the input signal spectrum. The ouput of the DCT is the set of 64 basis-signal amplitudes, i.e., the DCT coefficients, whose values are the relative amount of the 2D spatial frequencies contained in the 64-point discrete signal.

The DCT coefficients are partitioned into a DC coefficient and AC coefficients. The DC coefficient corresponds to the coefficient with zero frequency in both spatial dimensions, and the AC coefficients are the remaining coefficients with non-zero frequencies. For most blocks, the DCT coefficients usually concentrate in the lower spatial frequencies. In others words, most of the spatial frequencies have near-zero amplitude, which do not need to be encoded.

To achieve compression, each of the 64 DCT coefficients is uniformly quantized in conjunction with a 64-element quantization table, which is specified by the application. The purpose of quantization is to discard information which is not visually significant. Because quantization is a many-to-one mapping, it is fundamentally a lossy transform. Moreover, it is the principal source of compression in DCT-based encoder. Quantization is defined as division of each DCT coefficient by its corresponding quantization step size, followed by rounding to the nearest integer. Each step size of quantization is ideally selected as the perceptual threshold to compress the image as much as possible without generating any visible artifacts. It is also a function of the image and display characteristics.

There are some processing steps applied to the quantized coefficients. The DC coefficient is treated separately from the 63 AC coefficients. Because there is usually strong correlation between the DC coefficients of adjacent blocks, the quantized DC coefficient is encoded as the difference from the DC term of the previous block in the encoding order, called differential pulse code modulation (DPCM). DPCM can usually achieve further compression due to the smaller range of the coefficient values. The remaining AC coefficients are ordered into a zigzag sequence, which helps to facilitate entropy coding by placing low-frequency coefficients before high-frequency coefficients. Then, the outputs of DPCM and zigzag scanning are encoded by entropy coding methods, such as Huffman coding, and arithmetic coding.

Entropy coding can be considered as a two-step process. The first step converts the zigzag sequence of quantized coefficients into an intermediate sequence of symbols. The second step converts the symbols to a data stream in which the symbols no longer have externally identifiable boundaries. The form and definition of the intermediate symbols is dependent on both the DCT-based mode of operation and the entropy coding method.

In general, JPEG is not suitable for graphs, charts and illustrations especially at low resolutions. The very high compression ratio severely affects the quality of the image, although the overall colors and image form are still recognizable. However, the precision of colors suffer less (for the human eye) than the precision of contours (based on luminance).

Conventional image and video compression schemes mainly aim at optimizing pixel-wise fidelity such as peak signal-to-noise ratio (PSNR) for a given bit-rate. It has been noticed that PSNR is not always a good metric for the visual quality of reconstructed images, while the latter is regarded as the ultimate objective of compression schemes. There are several attempts to design compression methods towards visual quality, in which some image analysis tools such as segmentation and texture modeling are utilized to remove the perceptual redundancy. The basic idea is to remove some image regions by the encoder, and to restore them by the decoder by inpainting, or synthesis methods.

The limitation of block size hinders drastically the existing compression algorithms performance especially when the underlying texture exhibits other spatial structures.

SUMMARY OF THE INVENTION

The embodiments of the invention provide methods for compressing and decompressing images. For images that exhibit vertical and horizontal texture patterns, e.g., building façade images, textile designs, etc., the methods produces a representation that includes a column matrix D, and a row matrix X. This representation achieves significantly high and scalable compression ratios.

Other types of images that can be converted into matrices, e.g., a circular shaped pattern of a tire image can be unwrapped onto rectangular area such, flower images, iris images, can also be efficiently compressed using our method.

We convert a block of m×n pixels of a gray-level image into a 2D m×n matrix. We determine the m×k column matrix and a k×n row matrix decomposition of the original 2D matrix, where the width of the column matrix is substantially smaller than its height k<<m, and the height of the row matrix is substantially smaller than its width k<<n. For example, the column matrix can be from 640×2 to 640×16 and the corresponding row matrix from 2×480 to 16×480 pixels.

In one embodiment, the column matrix is considered as a dictionary, and the row matrix as a sparse reconstruction matrix.

We describe alternative methods to represent the 2D matrix, in addition to the multiplication of a column matrix and a row matrix. One method determines a diffusion matrix (DM) to further decrease the size of the column matrix. The diffusion matrix can be selected such that it changes the sizes of the column and row matrices to emphasize the quality of either or both of the vertical and horizontal textures in the image.

Another method further compresses the column and row matrices using the periodicity information and repetition, and by applying a Fourier transform, and clustering.

As an optional preprocessing step, we separate the matrix into a low-rank term and a sparse error term by applying principal component analysis (PCA), before decomposing the matrix. We solve an optimization problem that removes variability among similar regions in the matrix.

To obtain the decomposition and learn the column matrix, we apply a singular value decomposition (SVD), or its k-means version (K-SVD). The SVD is optimal for non-sparse representations, and K-SVD is sub-optimal but better suited to sparse coefficients. In other embodiments, we apply matrix decomposition, for instance, rank decomposition and non-negative matrix factorization to determine the column matrix and row matrix.

We use a quantized version of a matching pursuit process to determine the coefficients of the row matrix. Matching pursuit involves finding optimal projections of multi-dimensional data onto an over-complete codebook. We quantize and carry-forward the error during the projection step. This method combines error due to quantization and approximation in a single step.

In other embodiments, we use an orthogonal matching pursuit, and a compressive sensing matching pursuit. We can use any matching pursuits including orthogonal matching pursuit and compressive sampling matching pursuit for this purpose.

For further compression to obtain extreme gains in the bit-rate, we apply a second decomposition to the column matrix. We estimate the periodicity of the column matrix by applying the Fourier transform, and select only the one period of the column matrix, and disregard the remaining coefficients. In the decoder, we construct the entire matrix by repeating the selected period.

In another embodiment, we cluster the column matrix for additional compression. The rows of the column matrix are clustered using k-means, spectral k-means, or agglomerative clustering. Cluster centers and labels are transmitted. The choice of the number of clusters is guided by the target bit-rate, and minimum required PSNR. More clusters achieve a higher bit-rate. Fewer of clusters lower the PSNR.

DETAILED DESCRIPTION OF THE PREFERRED EMBODIMENT

Figure 1:
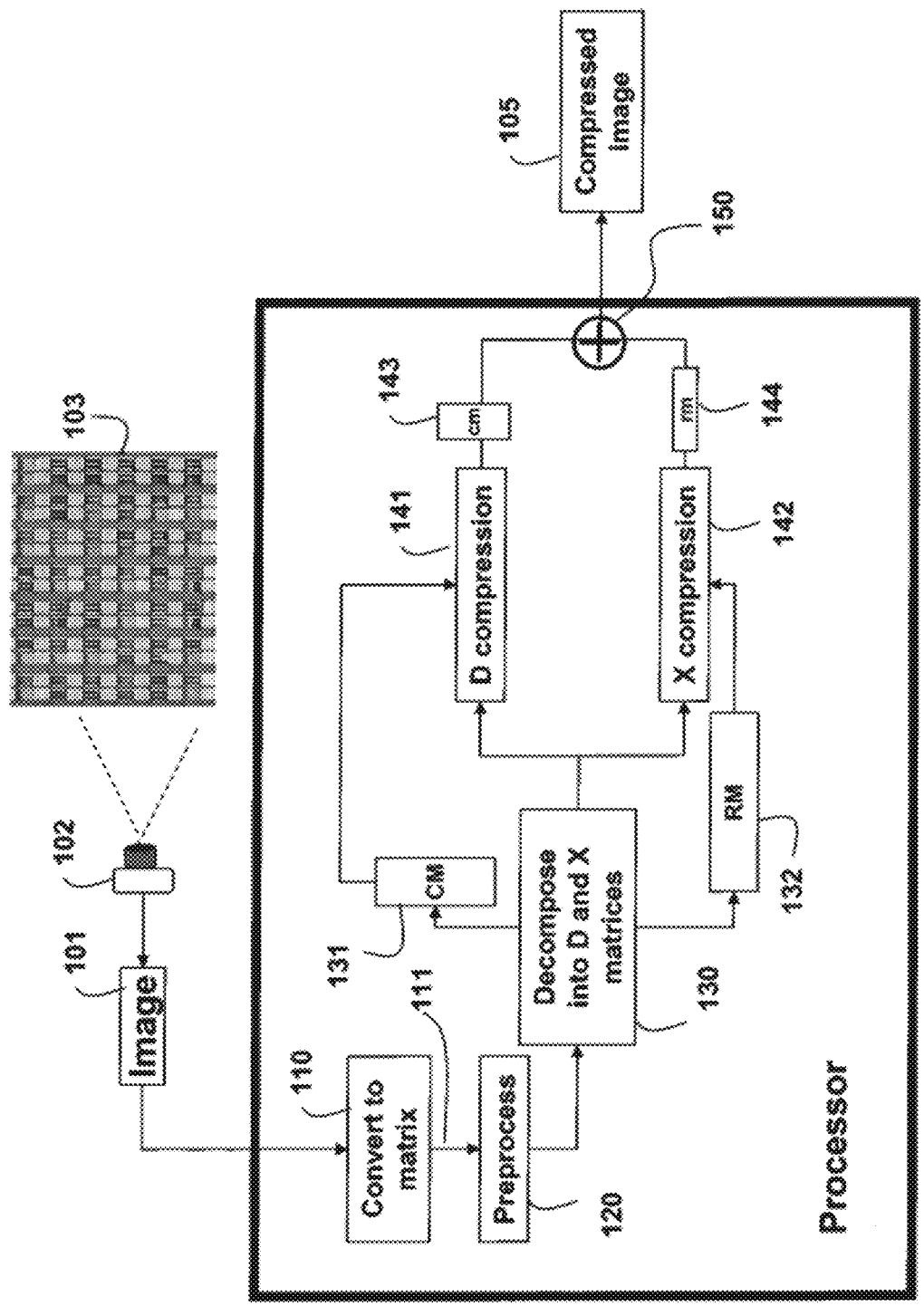
FIGS. 1-2 and 4 are schematics of embodiments of methods for compressing an image.

As shown in FIG. 1. 1-5, the embodiments of the invention provide a method for compressing and decompressing images. As shown, the steps of the methods can be performed in a processor connected to a memory and input/output interfaces as known in the art.

An image 101 is acquired by a camera 102 of a scene, e.g., a building façade 103.

We convert 110 each block of m×n pixels of the image Y 101 into a 2D m×n matrix A 111.

In an optional preprocessing step 120, we partition the matrix into a low-rank term and a sparse error term by applying principal component analysis. We can also solve an optimization problem to remove variability among similar regions in the matrix.

We decompose 130 the matrix to obtain a column matrix D 131, and coefficients matrix X 132, such that Y=DX, where D is m×k, and X=k×n, and k<<min(m×m). In other words, the final representations D and X is significantly smaller than the image Y. Processes that can be used to perform the factorization are a singular value decomposition (SVD), and a k-means singular value decomposition (K-SVD).

We apply column compression 141 to the column matrix and coefficient compression 142 to the row matrix X compression 132 to produced corresponding compressed matrices 143-144, which when combined (⊕) 150 form the compressed image 109.

SVD Based Factorization

Figure 2:
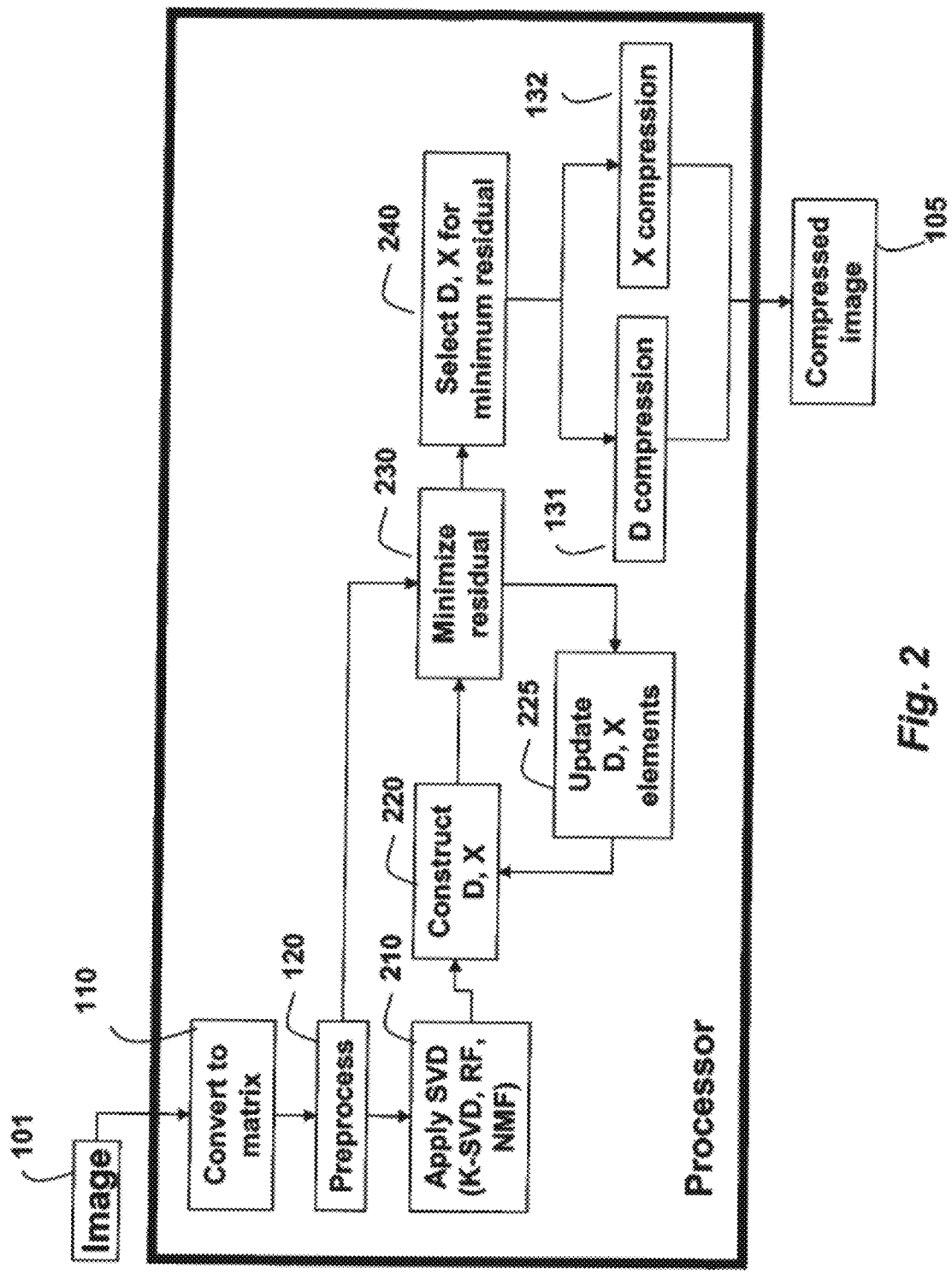

In the case of the SVD 210, as shown in FIG. 2, the optimization problem is $$\min\|Y-DX\|^2_F.\qquad\text{a.}$$

where F is a Frobenius norm of a matrix, which is defined as a square-root of a sum of squared values of all coefficients, or equivalently the square-root of a trace of the matrix left multiplied with a conjugate transpose.

In other words, we want to approximate the image Y as accurately as possible in terms of a linear transformation of X and D by minimizing 230 a residual error.

The SVD represents an expansion of the original data in a coordinate system where a covariance matrix is diagonal. The SVD factors a matrix. The SVD of the m×n matrix A is a factorization of the form $$A=U\Sigma V^*,$$

where U is a m×m unitary matrix, Σ is a m×n diagonal matrix with nonnegative real numbers on the diagonal, and V*, is the conjugate transpose of V, is a n×m unitary matrix. The diagonal entries $\Sigma_i$ of Σ are the singular values of A. The in columns of U, and the n columns of V are the left singular vectors and the right singular vectors of A, respectively. A unitary matrix U satisfying the condition $$U^-U = UU^* = I_n,$$

where $I_n$ is a n×n identity matrix. The SVD determines the eigenvalues and eigenvectors of $AA^T$, and $A^TA$.

The SVD and the eigendecomposition are closely related. The left singular vectors of A are eigenvectors of AA*. The right singular vectors of A are eigenvectors of A*A. The nonzero singular values of Σ are the square roots of the nonzero eigenvalues of AA*. The right singular vectors of A are the eigenvectors of A*A or AA*. The SVD determines the pseudoinverse, least squares fitting of data, matrix approximation, and determining the rank, range, and null space of a matrix.

The singular values are the square roots of the eigenvalues of AA*. The values of Σ are usually listed in decreasing order. The singular values are always real numbers. If the matrix A is a real matrix, then U and V are also real.

The variance of the $i^{th}$ principal component is the $i^{th}$ eigenvalue. Therefore, the total variation exhibited by the data matrix (A) is equal to the sum of all eigenvalues. Eigenvalues are often normalized, such that the sum of all eigenvalues is 1. A normalized eigenvalue indicates the percentage of total variance explained by its corresponding structure.

The largest eigenvectors points in directions where the data jointly exhibits large variation. The remaining eigenvectors point to directions where the data jointly exhibits less variation. For this reason, it is often possible to capture most of the variation by considering only the first few eigenvectors. The remaining eigenvectors, along with their corresponding principal components, are truncated. The ability of SVD to eliminate a large proportion of the data is a primary reason for its use in compression.

K-SVD Based Factorization

In the case of the K-SVD, the optimization problem is of the form $$\min \|Y - DX\|_F^2$$

such that $\|x_i\| \leq S$ for all i, where $x_i$ indicates the $i^{th}$ column of X, and S is a sparsity constraint, $S \leq K$, and where F is a Frobenius norm of a matrix, which is defined as a square-root of a sum of squared values of all coefficients, or equivalently the square-root of a trace of the matrix left multiplied with a conjugate transpose.

K-SVD constructs 220 a sparse representation of the image the form of D and X. Using an over-complete codebook that contains prototype elements, image regions are described by sparse linear combinations of these elements. Designing codebooks to better fit the above model can be done by either selecting 240 one from a predetermined set of linear transforms, or adapting the codebook to a set of training signals.

Given a set of training signals, the K-SVD determines the codebook that leads to the best representation for each member in the set, under strict sparsity constraints. The K-SVD generalizes the k-means clustering process. K-SVD is an iterative method that alternates between sparse coding of the pixels based on the current codebook and a process of updating 225 the codebook elements to better fit the data. The update of the codebook vectors is combined with an update of the sparse representations to accelerate convergence. The K-SVD can work with any pursuit method. In one embodiment, orthogonal matching pursuit (OMP) is used for the sparse encoding step.

Let us first consider the sparse encoding stage, where a size of D is fixed, and consider the above optimization problem as a search for sparse representations with coefficients summarized in the matrix X. The residual (penalty term) can be rewritten as $$\|Y - DX\|_F^2 = \sum_{i=1}^m \|y_i - Dx_i\|^2.$$

Therefore, the optimization problem described above can be decoupled to distinct problems of the form $$\min \|y_i - Dx_i\|_F^2,$$

subject to $\|x_i\|_0 \leq S$ for all i.

If S is small enough, then the solution is a good approximation to the ideal one that is numerically infeasible to determine.

Updating the codebook together with the nonzero coefficients in X is done iteratively, as shown. Assume that both D and X are fixed, and we put in question only one column $d_i$ in the codebook D, and the coefficients that correspond to the codebook element $d_i$, the $i^{th}$ row in X, is denoted as $x_i$. Note that this is not the vector $x_i$i, which is the $i^{th}$ column in X. The residual can be rewritten as $$\|Y - DX\|_F^2 = \left\| Y - \sum_{j=1}^K d_j x^j \right\|_F^2 = \|E_k - d_k x^k\|_F^2.$$

Above, we have decomposed the multiplication DX to the K sum of rank-1 matrices. Among those, K-1 terms are assumed fixed, and one that is the $k^{th}$ remains in question. The matrix $E_k$ is the error for all the pixels when the $k^{th}$ element is removed.

Use of the SVD to determine alternative $d_k \times x^k$ would be incorrect, because the new vector $x^k$ is very likely to be filled, because in such an update of $d^k$ we do not enforce the sparsity constraint. We define $w_k$ as the group of indices pointing to pixels $\{y_i\}$ that use the element $d_k$, i.e., those where $x^k(i)$ is nonzero $$w_k = (i | 1 \leq i \leq K, \text{ for all non-zero } x_k(i)).$$

We define $\Omega_k$ as a matrix with ones on the $w_k^{th}$ entries, and zeros elsewhere. When multiplying $x^k_R = x^k \Omega_k$, this compresses the row vector by discarding of the zero entries, resulting with the row vector $x^k_R$. Similarly, the multiplication $Y^R_k = Y \Omega_k$ constructs a matrix that includes a subset of the pixels that are currently using the $d^k$ element and $E^R_k \Omega_k$ is the selection 240 of error columns that correspond to pixels that use the element $d_k$.

We can minimize 230 the residual with respect to $d_k$ and x to force the solution to have the same support as the original. This is equivalent to the minimization of $$\|E_k \Omega_k - d_k x^k \Omega_k\|_F^2,$$

which can be done directly via the SVD. The SVD decomposes $E^R_k$ to $U \Sigma V^*$. We define the solution for $d_k^d$ as the first column of U, and the coefficient vector $x^k_R$ as the first column of V multiplied by $\Sigma_{1,1}$. In this solution, we the columns of D remain normalized, and the support of all representations either stays the same, or gets smaller by possible nulling of terms.

To summarize, K-SVD alternates between sparse encoding and codebook update. After initializing the codebook matrix $D^0$ with normalized columns, we repeat the encoding, and update phases until convergence or a termination condition is reached.

In the sparse encoding stage, we use the marching pursuit to determine the representation vectors $x_i$ for each pixel $y_i$ by minimizing a residual error $$\min \|y_i - Dx_i\|^2_{xi},$$

subject to $\|x_i\|_0 \leq S$.

In the codebook update stage, we update each column k in D by defining a group of pixels that use element $w_k$, determining the overall representation error matrix $E_k$ by $$E_k = Y - \sum_{j \neq k} d_j x^j,$$

restricting $E_k$ by only selecting the columns corresponding to $w_k$ and obtain $E^R_k$, and finally applying the SVD decomposition $E^R_k = U\Sigma V^*$ to select the updated codebook column to be the first column of U, and coefficient vector $x^k_R$ to be the first column of V multiplied by $\Sigma_{1,1}$.

For very small values of K, e.g., K=2 or 4, we allow S=K. However, we still use OMP due to the fact that some columns in the image may be well represented well with just one of the codebook elements. In such a case, the OMP gives a sparser solution compared to a straightforward pseudo-inverse. For larger values of K, e.g., 16 or 21, we vary $1 \leq S \leq K$.

Rank Factorization (RF)

A rank factorization of the matrix A is a product A=UV, where U is an m×k matrix and V is an k×n matrix given a m×n matrix A of rank r.

To construct the rank factorization we can compute Z, the row canonical form of A where in Z all nonzero rows (rows with at least one nonzero element) are above any rows of all zeroes, and the leading coefficient (the first nonzero number from the left, also called the pivot) of a nonzero row is always strictly to the right of the leading coefficient of the row above it. Then U is obtained by removing from A all non-pivot columns, and V by eliminating all zero rows of Z.

In one embodiment we apply a low-rank factorization instead of a full-rank factorization.

Non-Negative Matrix Factorization (NMF)

A non-negative matrix factorization of A is a product A UV, where U is an m×k non-negative matrix and V is an k×n non-negative matrix given a m×n matrix A. A non-negative matrix is a matrix that all elements are equal to or greater than zero.

In the case of the NMF, the optimization problem is $$\min \|Y - DX\|^2_F.$$

where D and X are non-negative matrices.

Pre-Processing

In the optional pre-processing step 120, we separate the image into a low-rank term L and a sparse error term R following a robust principal component analysis (RPCA) as Y=L+R, see U.S. Pat. No. 7,574,019, and references described therein The sparse error term is then either compressed separately or discarded depending on whether it has essential or relevant information for the image at hand. If the original and low-rank images are appear sufficiently similar to recognize the image in question, then the sparse error term can be discarded.

For building images, consider a building that has curved windows and some artistic designs, which cannot be well-suited for block-based or row/column-based compression. After separating the image for this building into a low-rank term and a sparse error term, we can compress the low-rank part using our column matrix approach. In the case of this image, the sparse error holds important information regarding the shape of the windows, as well as the artistic designs, and hence should be encoded separately.

The variations such as open windows, curtains or blinds contribute to minor intensity variations across the structure of the building. Open windows and half-open blinds are removed in the low-rank term so that all the windows are appear uniform. These variations are encompassed by the sparse error term, and are not important for the recognition of the building. Thus, in this case, the sparse error term can be discarded altogether.

We use the inexact augmented Lagrangian multiplier (ALM) method for separating the low-rank and sparse error terms.

RPCA requires recovering a low-rank matrix with unknown fractions of its entries being arbitrarily corrupted. It is possible to solve RPCA via convex optimization that minimizes a combination of the nuclear norm and the $l^1$ norm. For convex optimization, we apply a modified inexact version of the augmented Lagrange multipliers, which has a Q-linear convergence speed and requires significantly less partial SVDs than the exact augment Lagrange multipliers method.

For other types of images, we first apply a transform to the input image to obtain a texture that is dominant with vertical and horizontal patterns.

Figure 5:
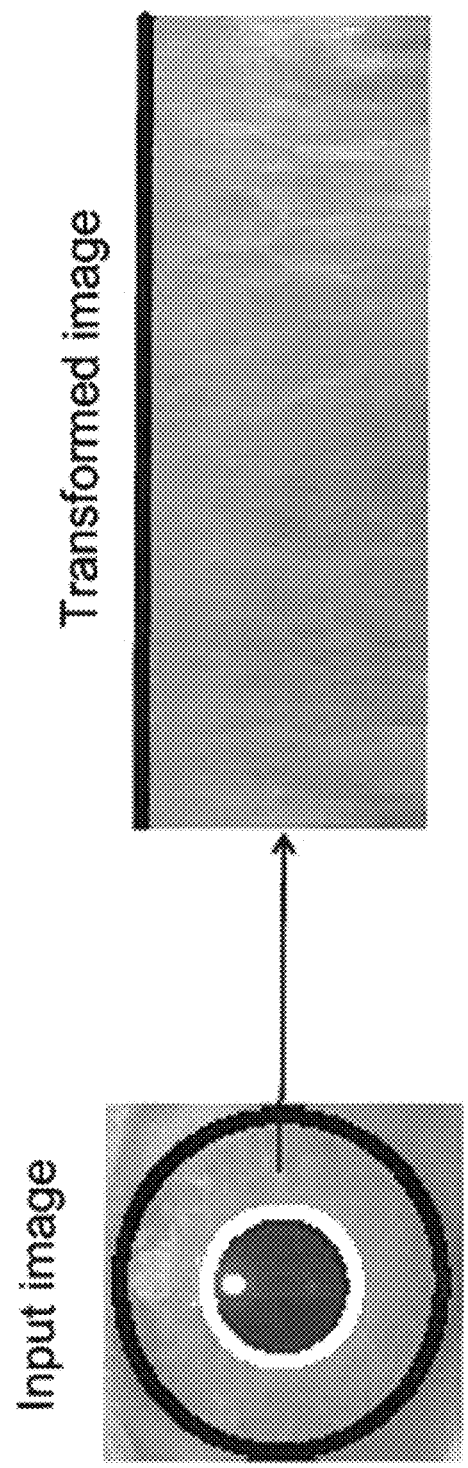
FIG. 5 is an illustration of the spatial transform of an image depicting circular pattern.

Images that depict circular patterns are applied a spatial transform that maps the pixels in polar coordinates onto Cartesian coordinates. Images that contain straight lines but oriented diagonally are rotated such that the lines become either vertical or horizontal to image axes. For instance we convert the disc shaped iris image into a rectangle image by assigning pixels located on concentric circular bands around the center of the pupil onto consecutive columns in a rectangular image, as illustrated in FIG. 5.

Row Compression

For certain class of images, for instance for building façade images, the multiple floors of a building are generally similar in appearance, and there also exists some similarity among the pixel rows in a floor. We can exploit this similarity by considering the m rows of the column matrix as data points and compressing the rows further. This can be done in one of two approaches:
  a. clustering the rows of the column matrix; or
  b. reducing the building column matrix to a "single-floor'" column matrix by identifying a periodicity of floors in the building.

In both cases, the column matrix is further compressed.

Clustering

This method exploits the similarities of different floors, as well as within a single floor. The rows of the m×k column matrix are considered as points in $R^k$ and clustered using any potential clustering method. The column matrix can then be represented by the cluster centers along with the cluster indices. As a pre-processing step, the k-dimensional points are scaled to have unit variance, but this does not affect the reconstructed column matrix due to the re-normalization of the columns.

Periodicity

Another approach to capture the similarity among the multiple floors of a building is to identify the periodicity of each column matrix element taken as a signal by itself. Consider the column matrix elements $$d^i_c \text{ in } R^m$$

for i=1, . . . , k; each of these signals are periodic with the fundamental period S corresponding to the number of pixel rows per floor of the building. Then, we can represent the column matrix elements by S-dimensional vectors, forming a single-floor column matrix, $D_{floor}$, which is a submatrix of the column matrix D If the image of the building covers exactly eight floors, that is $$S = m/8,$$

then it is possible to just represent the column matrix elements by m/8-dimensional vectors, reducing storage by 85%.

To reconstruct the image we stack this smaller column matrix (the submatrix $D_{floor}$)

$$\lceil \frac{m}{s} \rceil$$

times, and truncate at m rows. Thus even if the image does not cover a whole number of floors, this method can still be applied. Note that the period estimation process requires the presence of at least two completely visible floors in the image. The period estimation is applied to all the column matrix elements simultaneously to return a single value for S.

While the reconstructed image from this floor-stacking procedure can appear artificially generated, it is nonetheless sufficient to represent the true structure of the building, ignoring variations across floors such as open windows, blinds and curtains which may be insignificant for a particular the application domain.

In another embodiment, we extend the DCT implementation along the columns of the image. A one-dimensional DCT is applied to the columns of the image, and further quantization and entropy coding is performed on the resulting coefficients. We refer to this method as a column-DCT.

The method yields much higher gains in terms of PSNR, as well as bit-rate. Even at low bit-rates, the PSNR gain achieved by our method is notable. For PSNR values corresponding to good visual quality, the bit-rates obtained by our method are at least 3-4 times smaller than JPEG in most images. Further, the images obtained from the row-column matrix approach are much crisper along the edges, without smoothing, or blocking effects.

Figure 4:
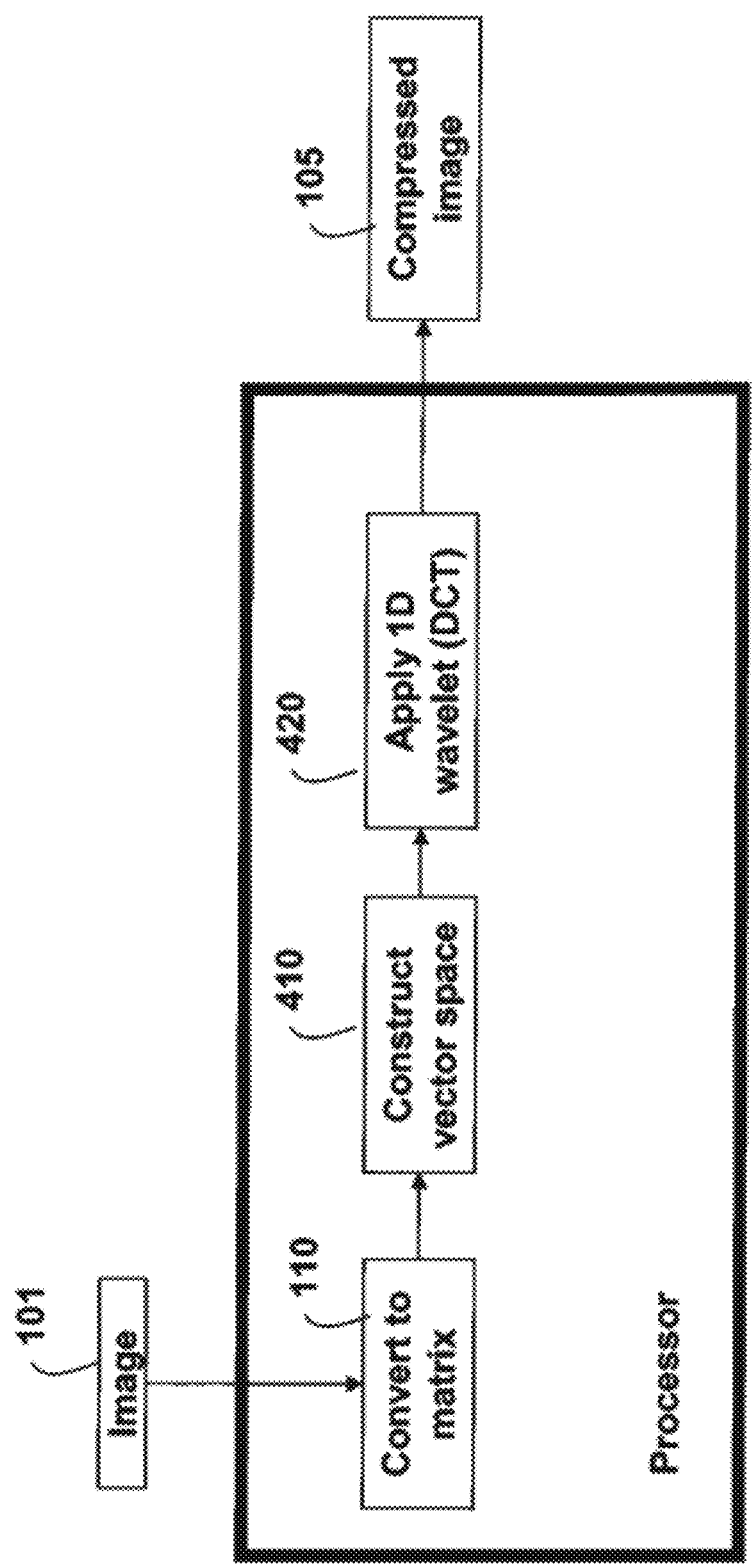

As shown in FIG. 4, we can also construct 410 a vector space, and apply 420 a 1D wavelet (or DCT transforms) to the vectors that correspond to matrix rows or columns. We partition the matrix into 1D vectors to obtain a vector space, and then cluster the vectors in this space with a given cluster number. We apply 1D wavelet (or DCT transform) to obtain the compressed image.

As the last step of the row and column matrix compression, we quantize and entropy encode both matrices by Huffman coding for transmission.

For multi-spectral and color images, we either:
construct a larger 2D matrix when we convert the image into matrix form; or treat each color channel separately.

In the case of images of building facades, due to the highly aligned nature of the images, as well as the strong horizontal and vertical structures, one approach deals with image columns and rows as the building blocks. Due to the repetitive nature of the facade images, in terms of multiple floors of the building and adjacent pillars/windows along the same floor, this method is well-suited for the compression of this type of images.

Instead of representing each square block in a transform domain for e.g., DCT, where it would be sparse, it is much more appropriate to represent each column in the image in the way we describe herein.

As an advantage, this method maintains the crispness of the horizontal and vertical edge structures, which are pre-dominant in building facades. In contrast, other block-based methods suffer from an intrinsic bluffing of edges due to approximation and quantization.

The row matrix can be considered as the column matrix to apply the method above to the row matrix.

Decompressing

Figure 3:
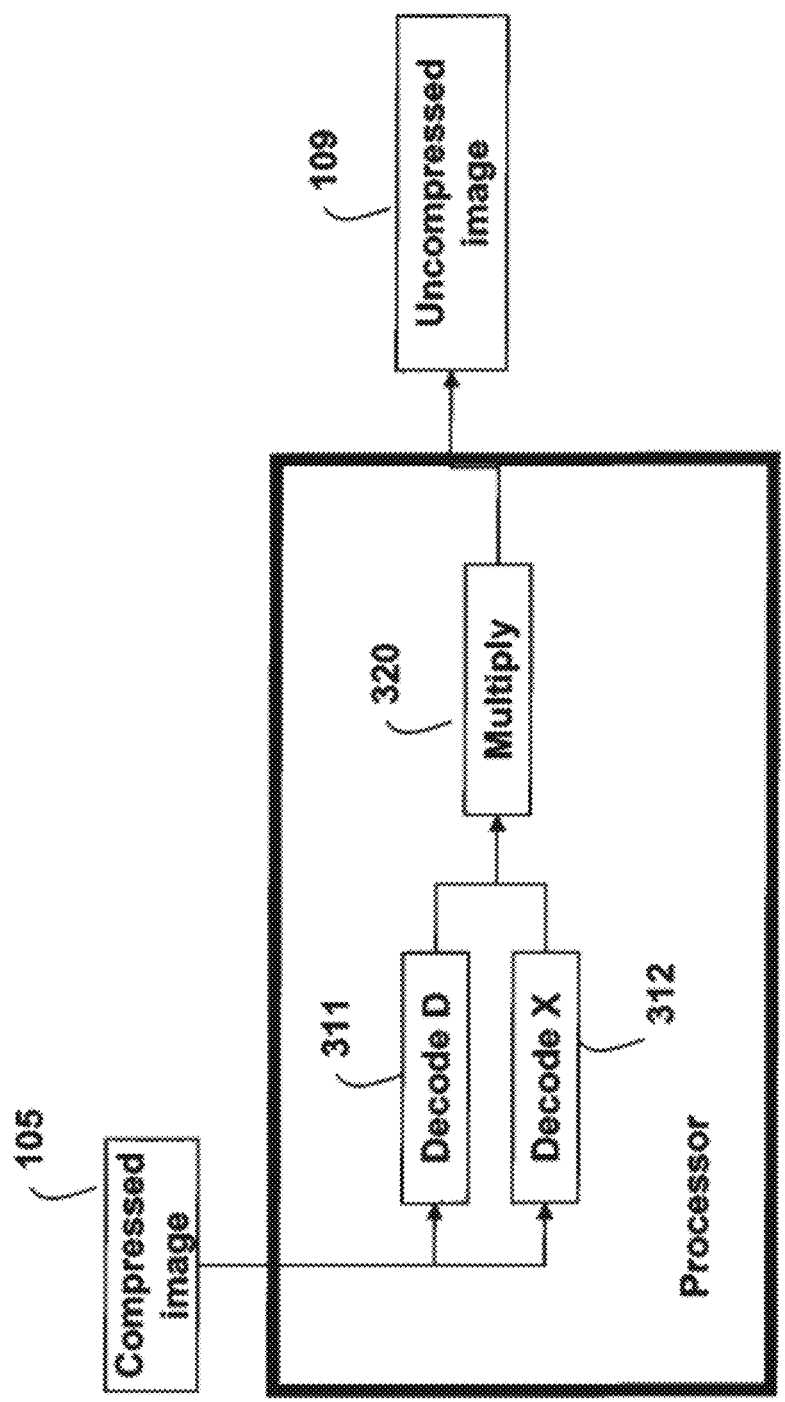
FIG. 3 is a schematic of a method for decompressing a compressed image according to embodiments of the invention.

During image reconstruction as shown in FIG. 3, the column matrix is first reconstructed and normalized by decoding 311 the compressed image 105, and multiplied 320 with the decoded 312 row matrix to obtain the decompressed image 109.

EFFECT OF THE INVENTION

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

I claim:

1. A method for compressing an image partitioned into blocks of pixels, for each block comprising the steps of:
converting the block to a 2D matrix;
decomposing the matrix into a column matrix and a row matrix, wherein a width of the column matrix is substantially smaller than a height of the column matrix and the height of the row matrix is substantially smaller than the width of the row matrix;
compressing the column matrix and the row matrix to produce corresponding compressed columns matrix and compressed row matrix; and,
combining the compressed column matrix and the compressed row matrix to form a compressed image, wherein the steps are performed in a processor.

2. The method of claim 1, further comprising:
partitioning the 2D matrix into a low-rank term and a sparse error term by applying principal component analysis.

3. The method of claim 1, further comprising:
removing variability among similar regions in the matrix.

4. The method of claim 1, wherein the decomposing is a singular value decomposition (SVD).

5. The method of claim 1, wherein the decomposing is a k-means singular value decomposition (K-SVD).

6. The method of claim 4, wherein the image is Y, the column matrix is D, and the row matrix is X, and wherein the decomposing minimizes a residual error $\|Y-DX\|^2_F$ where F is a Frobenius norm.

7. The method of claim 5, wherein the image is Y, the column matrix is D, and the row matrix is X, and wherein the decomposing minimizes a residual error $\min\|Y-DX\|^2_F$, such that $\|x_i\| \leq S$ for all i, where $x_i$ indicates an $i^{th}$ column of X, and S is a sparsity constraint, such that $S \leq K$, and where F is a Frobenius norm.

8. The method of claim 7, wherein the K-SVD uses a matching pursuit process.

9. The method of claim 7, wherein the K-SVD alternates between sparse encoding and codebook update until convergence or a termination condition is reached.

10. The method of claim 9, wherein the sparse encoding stage determines vectors $x_i$ for each pixel y, by minimizing the residual $\min \|y_i - Dx_i\|^2_{xi}$, subject to $\|x_i\| \leq S$.

11. The method of claim 10, wherein the codebook update each column k in D by defining a group of pixels that use an element $w_k$, and further comprising:

determining an overall representation error matrix $E_k$ by $$E_k = Y - \sum_{j \neq k} d_j x^j;$$

and restricting $E_k$ by only selecting the columns corresponding to $w_k$ and obtain $E^R_k$, and applying the SVD decomposition $E^R_k = U\Sigma V^*$ to select the updated column matrix column to be a first column of U, and coefficient vector $X^k_R$ to be the first column of V multiplied by $\Sigma_{1,1}$.

12. The method of claim 2, further comprising:
separating the low-rank term and the sparse error terms using a Lagrangian multiplier.

13. The method of claim 1, wherein the image is of a façade of a building with multiple floor, and further comprising:
reducing the column matrix to a single-floor column matrix by identifying a periodicity of floors in the building.

14. The method of claim 1, further comprising:
decompressing the compressed image by decoding the compressed column matrix and the compressed row matrix, and multiplying the decoded column matrix by the decoded row matrix.

15. The method of claim 1, wherein the block of pixels corresponds to the entire image.

16. The method of claim 1, further comprising:
clustering the rows of the column matrix using a target bit-rate and a target quality parameter.

17. The method of claim 1, further comprising:
finding the smallest dominant frequency for the column matrix by Fourier transform;
selecting a submatrix of the column matrix according to the smallest dominant frequency for compressing the column matrix; and
repeating the submatrix to reconstruct the column matrix in the decompression.

18. The method of claim 1, further comprising:
partitioning the 2D matrix into 1D vectors;
applying a 1D transform to 1D vectors to obtain transform coefficients and ordering the transform coefficients with respect to their values; and,
selecting the highest values transform coefficients for further compression.

19. The method of claim 18, wherein the 1D transform is a wavelet transform.

20. The method of claim 18, wherein the 1D transform is a discrete cosine transform.

21. The method of claim 1, further comprising:
compressing the column matrix and row matrix by entropy coding.

22. The method of claim 1, further comprising:
applying a spatial transform to the input image in a preprocessing stage to obtain an image with vertical and horizontal patterns.

23. The method of claim 22, wherein the spatial transform maps pixels in polar coordinates to Cartesian coordinates for input image with circular patterns.

24. The method of claim 1, wherein the image is a multispectral image and the 2D matrix conversion maps each channel into a separate 2D matrix.

25. The method of claim 1, wherein the image is a multispectral image and the 2D matrix conversion maps all channels into a single 2D matrix.

26. The method of claim 1, further comprising:
determining a diffusion matrix between the column matrix and row matrix wherein a width of the column matrix is smaller than a width of the column matrix without a diffusion matrix and a height of the row matrix is smaller than the height of the row matrix without a diffusion matrix; and
compressing the diffusion matrix.

27. The method of claim 1, wherein the decomposing is a rank factorization.

28. The method of claim 1, wherein the decomposing is a non-negative matrix factorization.

* * * * *